US011366967B2

(12) United States Patent
Mutalikdesai et al.

(10) Patent No.: US 11,366,967 B2
(45) Date of Patent: Jun. 21, 2022

(54) LEARNING ROADMAPS FROM UNSTRUCTURED TEXT

(71) Applicant: INTERNATIONAL BUSINESS MACHINES CORPORATION, Armonk, NY (US)

(72) Inventors: Mandar Mutalikdesai, Karnataka (IN); Rahul Reddy Nimmakayala, Karnataka (IN); Ashish Rao, Karnataka (IN); Sheetal Srivastava, Karnataka (IN); Kartikeya Vats, Karnataka (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 428 days.

(21) Appl. No.: 16/521,079

(22) Filed: Jul. 24, 2019

(65) Prior Publication Data
US 2021/0026921 A1  Jan. 28, 2021

(51) Int. Cl.
*G06F 40/00* (2020.01)
*G06F 40/295* (2020.01)
(Continued)

(52) U.S. Cl.
CPC ............ *G06F 40/295* (2020.01); *G06F 17/10* (2013.01); *G06F 30/18* (2020.01); *G06K 9/6269* (2013.01)

(58) Field of Classification Search
CPC ...... G06F 40/216; G06F 40/20; G06F 40/247; G06F 40/242; G06F 40/237; G06F 40/253; G06F 40/268; G06F 40/279; G06F 40/284; G06F 40/289; G06F 40/295; G06F 40/30; G06F 40/35; G06F 2101/00; G06F 2101/02; G06F 2101/06; G06F 2101/14; G06F 40/10; G06N 5/025; G06N 5/02;
(Continued)

(56) References Cited

U.S. PATENT DOCUMENTS 9,129,002 B2 * 9/2015 Kobayashi ............ G06F 16/285
9,779,632 B2 10/2017 Shakeri et al.
(Continued)

FOREIGN PATENT DOCUMENTS

JP  2016-530555  6/2016

OTHER PUBLICATIONS

Beliga, S., Meštrović, A., & Martinčić-Ipšić, S. (2015). An overview of graph-based keyword extraction methods and approaches. Journal of information and organizational sciences, 39(1), 1-20. (Year: 2015).*

(Continued)

*Primary Examiner* — Edgar X Guerra-Erazo
(74) *Attorney, Agent, or Firm* — F. Chau & Associates, LLC

(57) ABSTRACT

Systems and methods are described for generating learning roadmaps from unstructured information. The systems and methods may provide for extracting a plurality of named entities from one or more corpora of information, constructing a graph based on the named entities, inducing a subgraph from the graph based on a target named entity, wherein the subgraph includes a subset of the named entities, ordering the subset of the named entities based on the subgraph, and generating a learning roadmap for the target named entity based on the ordering.

13 Claims, 9 Drawing Sheets

(51) Int. Cl.
*G06K 9/62* (2022.01)
*G06F 17/10* (2006.01)
*G06F 30/18* (2020.01)

(58) Field of Classification Search
CPC ........ G06N 5/022; G06N 20/00; G06N 20/10;
G06N 20/20; G06N 3/0445; G06N 3/082;
G06N 3/088; G06N 3/08; G06N 7/005;
G06N 5/003; G10L 15/01; G10L 15/04;
G10L 15/05; G10L 15/08; G10L
2015/081; G10L 15/083; G10L 2015/085;
G10L 15/18; G10L 15/1807; G10L
15/1815; G10L 15/1822; G10L 15/183;
G10L 15/10; G10L 15/193
See application file for complete search history.

(56) References Cited

U.S. PATENT DOCUMENTS

| | | | | |
|---|---|---|---|---|
| 9,904,699 | B2* | 2/2018 | Walkingshaw | G06F 16/9535 |
| 10,204,168 | B2* | 2/2019 | Parker | G06F 16/9566 |
| 10,726,018 | B2* | 7/2020 | Chakrabarti | G06F 16/24573 |
| 2002/0031268 | A1* | 3/2002 | Prabhakar | G06V 30/413 |
| | | | | 382/224 |
| 2006/0074821 | A1* | 4/2006 | Cristianini | G06N 20/00 |
| | | | | 706/12 |
| 2011/0179084 | A1* | 7/2011 | Waddington | G06Q 30/02 |
| | | | | 707/E17.098 |
| 2013/0185300 | A1* | 7/2013 | Kobayashi | G06F 16/285 |
| | | | | 707/737 |
| 2015/0227589 | A1* | 8/2015 | Chakrabarti | G06F 16/24564 |
| | | | | 707/748 |
| 2016/0217393 | A1* | 7/2016 | Yu | G06N 20/00 |
| 2017/0039297 | A1 | 2/2017 | Koutrika et al. | |
| 2017/0193393 | A1 | 7/2017 | Contractor et al. | |
| 2017/0337290 | A1* | 11/2017 | Parker | G06F 16/951 |
| 2018/0075038 | A1* | 3/2018 | Azvine | G06F 16/22 |
| 2018/0101535 | A1 | 4/2018 | Banerjee | |
| 2018/0182381 | A1* | 6/2018 | Singh | G06F 16/29 |
| 2018/0260913 | A1* | 9/2018 | Garti | G06Q 50/01 |
| 2019/0073420 | A1* | 3/2019 | Agapiev | G06F 16/9024 |

OTHER PUBLICATIONS

Amancio, D. R. (2016). Network analysis of named entity co-occurrences in written texts. EPL (Europhysics Letters), 114(5), 58005. (Year: 2016).*

D. Ajwani, B. Taneva, S. Dutta, P. K. Nicholson, G. Heyrani-Nobari and A. Sala, "ANNOTATE: orgANizing uNstructured cOntenTs viA Topic labEls," 2018 IEEE International Conference on Big Data (Big Data), 2018, pp. 1699-1708, doi: 10.1109/BigData.2018.8622647. (Year: 2018).*

Sun, J., Ajwani, D., Nicholson, P. K., Sala, A., & Parthasarathy, S. (Jun. 2017). Breaking cycles in noisy hierarchies. In Proceedings of the 2017 ACM on Web Science Conference (pp. 151-160) (Year: 2017).*

Zou, et al, "A flexible graph-based model for facilitating digital learning activities", International Journal of Innovation and Learning, vol. 23, Issue 4, 2 pages; found on the internet at: https://www.inderscienceonline.com/doi/abs/10/1504/IJIL/2018.092041.

Diwan, et al., "Computing Exposition Coherence Across Learning Resources", OTM 2018 Conferences, LNCS 11230, pp. 423-440, 2018.

* cited by examiner

LEARNING ROADMAPS FROM UNSTRUCTURED TEXT

TECHNICAL FIELD

The following disclosure relates generally to learning roadmaps, and more specifically, to generating learning roadmaps from unstructured information based upon basic-ness and advanced-ness measures.

BACKGROUND

Many endeavors depend on the ability of people to learn information about a target topic. In most cases, understanding a target topic depends on subtopics that provide contextual or foundational knowledge. For instance, understanding how "anti-money laundering techniques" work may depend on understanding more basic topics such as "money laundering", "bank transactions, and "banks and depositories".

Learning channels, such as in a classroom or a training environment, can provide structure to learning subtopics related to a target topic in a logical sequence. Outside of structured learning channels, much of a person's learning about new target topics happens by way of browsing through voluminous, unstructured content such as Wikipedia articles, academic literature, industry fora, or a corporate learning portal. In many cases, this unstructured learning may result in time and effort spent learning unnecessary topics. Furthermore, creating a structured learning path may also be time consuming. Therefore, there is a need in the art for an automated method of created a learning roadmap that provides a path for learning topics related to a target topic.

SUMMARY

A method, apparatus, and non-transitory computer readable medium for generating learning roadmaps from unstructured information are described herein. The method, apparatus, and non-transitory computer readable medium may provide for extracting a plurality of named entities from one or more corpora of information, constructing a graph based on the named entities, inducing a subgraph from the graph based on a target named entity, wherein the subgraph includes a subset of the named entities, ordering the subset of the named entities based on the subgraph, and generating a learning roadmap for the target named entity based on the ordering.

Another method, apparatus, and non-transitory computer readable medium for generating learning roadmaps from unstructured information are described. The method, apparatus, and non-transitory computer readable medium may provide for identifying a frequency count for each of a plurality of named entities in the corpus of text, identifying a co-occurrence count for each unordered pair of the named entities, identifying a conditional probability for each ordered pair of the named entities based on the frequency counts and the co-occurrence counts, wherein edges of the graph correspond to the conditional probabilities, generating an adjacency matrix, wherein entries of the adjacency matrix correspond to edges of the graph, multiplying the adjacency matrix by a transpose of the adjacency matrix to produce a product matrix, identifying an eigenvector of the product matrix, and ordering one or more of the named entities based on the values of the eigenvector.

Another method, apparatus, and non-transitory computer readable medium for generating learning roadmaps from unstructured information are described. The method, apparatus, and non-transitory computer readable medium may provide for extracting a plurality of named entities from one or more corpora of information, determining co-occurrence frequencies of pairs of named entities, building a graph based on the co-occurrence frequencies of pairs of named entities, inducing a subgraph for a target topic using the built graph, determining a rank of at least one of basic-ness and advanced-ness for each of the named entities in relation to the target topic, and ordering the named entities based on the basic-ness or advanced-ness.

DETAILED DESCRIPTION

Figure 1:
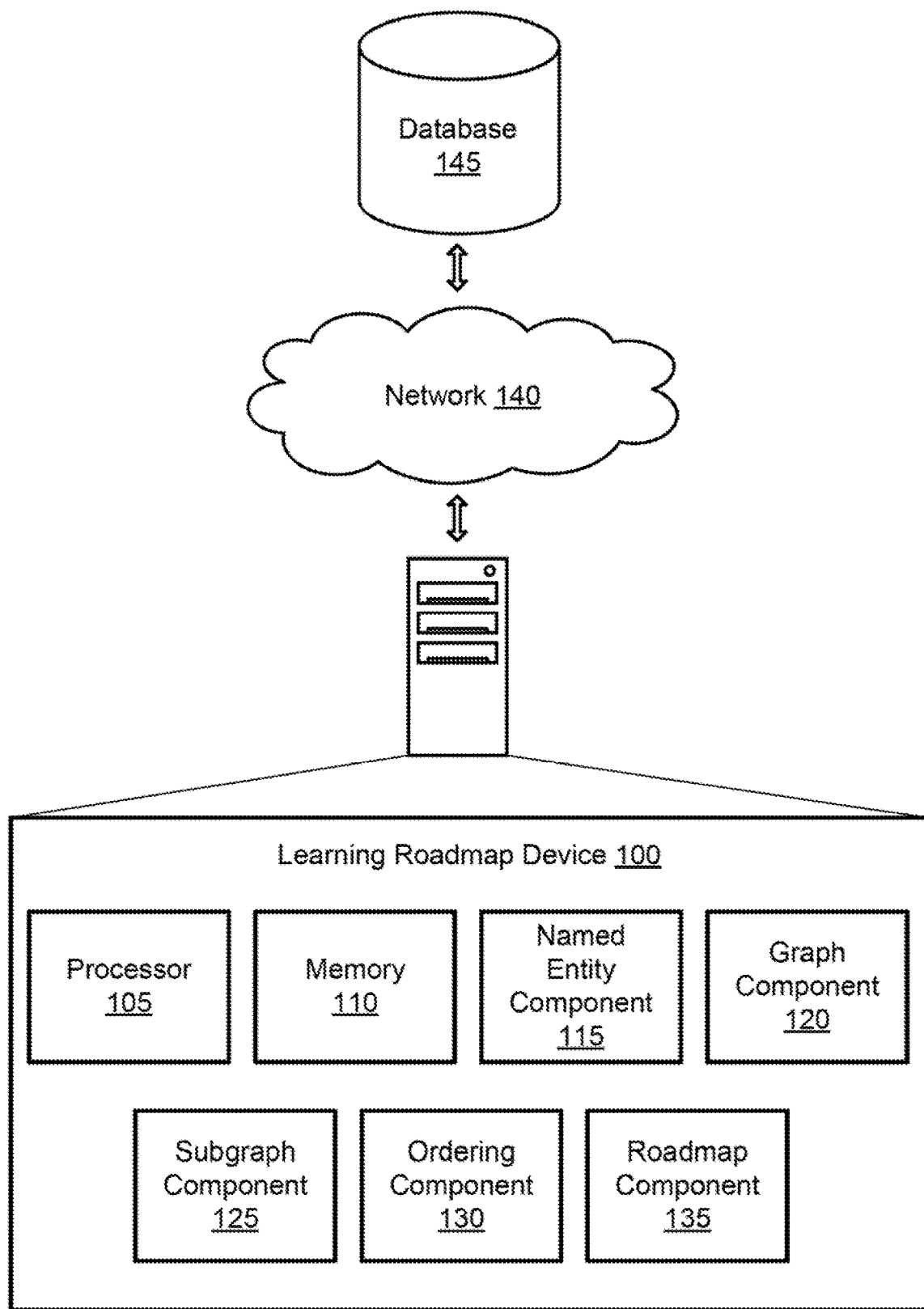
FIG. 1 shows an example of a learning roadmap device in accordance with aspects of the present disclosure.

Learning channels, such as in a classroom or a training environment, can provide structure to learning subtopics related to a target topic in a logical sequence. However, these traditional ontologies can be very expensive to develop or access and often require prior organization by a knowledgeable individual, as well as a degree of subjectivity with respect to a selected subtopic order. Outside of structured learning channels, much of a person's learning about new target topics happens by way of browsing through voluminous, unstructured content such as Wikipedia articles, academic literature, industry fora, or a corporate learning portal. However, a person may endeavor to learn about a new topic within a vast corpus of unstructured text, but find themselves unable to effectively do so because they do not understand the prerequisite topics very well. Furthermore, they may not know the ideal order for learning related topics.

For instance, an individual who wishes to understand how "anti-money laundering techniques" work may be unable to do so because of a lack of understanding of more basic topics such as "money laundering", "bank transactions, and "banks and depositories". Thus, an interested individual may be left overwhelmed and forced to inefficiently and tediously sift through material on related topics. Furthermore, the right learning roadmap for an individual to follow in order to learn and understand a target topic of their choice is rarely immediately apparent. Time and effort spent learning unnecessary topics, or attempting to learn a topic without the prerequisite knowledge can be inefficient and demoralizing.

Embodiments of the present inventive concept provide for developing a learning roadmap by 1) building a co-occurrence diagram (e.g., a co-occurrence graph), and 2) using the co-occurrence diagram (e.g., a co-occurrence graph) to determine ranks of basic-ness and advanced-ness scores for a plurality of named entities in the context of a target topic. A co-occurrence graph or matrix is used for determining a learning roadmap for a given target topic. The graph comprises topics (or "named entities") connected by directed edges that correspond to conditional probabilities of co-occurrence. The conditional probabilities are used in order to determine the relevance of one topic to another. Thus, the edges in the graph are derived from co-occurrences of the topics.

Given a target topic, a graph (e.g., a subgraph) may be induced by selecting other topics within a given neighborhood of the target. For example, all topics within a k-hop neighborhood of the target topic may be included in the subgraph. The subgraph forms the gamut of related topics for arrangement in the learning roadmap that ultimately leads to the target topic. The value of k can be changed to adjust the level of detail or length of the learning roadmap.

Once the subgraph (i.e., the set of topics to be ordered) is selected, the "basic-ness" and "advanced-ness" of a topic in the induced subgraph is determined. This is similar to the process used in the Hyperlink-Induced Topic Search (HITS) algorithm that computes the hub scores and authority scores of webpages in a web graph. However, the HITS algorithm involves finding authoritative information resources in a hyperlinked environment. By contrast, the present inventive concept incorporates a model for computing the basic-ness score and advanced-ness scores of named entities within a k-hop neighborhood of a target topic from any medium of extractable named entities (e.g., text). Topics appearing in the induced subgraph are ordered in decreasing order of their basic-ness scores or increasing order of advanced-ness scores towards the target topic. This forms the learning roadmap for a target topic.

Although steps in building a co-occurrence graph are described hereafter, the inventive concept is not limited thereto. For example, a chart or matrix may be used instead.

FIG. 1 shows an example of a learning roadmap device 100 in accordance with aspects of the present disclosure. The learning roadmap device 100 may include hardware or software components for generating a learning roadmap as described herein. The example shown includes learning roadmap device 100, network 140, and database 145. The learning roadmap device 100 may gather unstructured information (i.e., text descriptions of topics) from the database 145 via the network 140, and build a learning roadmap therefrom. Learning roadmap device 100 may include processor 105, memory 110, named entity component 115, graph component 120, subgraph component 125, ordering component 130, and roadmap component 135.

A processor 105 may include an intelligent hardware device, (e.g., a general-purpose processing component, a digital signal processor 105 (DSP), a central processing unit (CPU), a graphics processing unit (GPU), a microcontroller, an application specific integrated circuit (ASIC), a field programmable gate array (FPGA), a programmable logic device, a discrete gate or transistor logic component, a discrete hardware component, or any combination thereof). In some cases, the processor 105 may be configured to operate a memory 110 array using a memory 110 controller. In other cases, a memory 110 controller may be integrated into the processor 105. The processor 105 may be configured to execute computer-readable instructions stored in a memory 110 to perform various functions. In some examples, a processor 105 may include special purpose components for modem processing, baseband processing, digital signal processing, or transmission processing. In some examples, the processor 105 may comprise a system-on-a-chip.

A computer memory 110 may store information for various programs and applications on a computing device. For example, the storage may include data for running an operating system. The memory 110 may include both volatile memory 110 and non-volatile memory 110. Volatile memory 110 may include random access memory 110 (RAM), and non-volatile memory 110 may include read-only memory 110 (ROM), flash memory 110, electrically erasable programmable read-only memory 110 (EEPROM), digital tape, a hard disk drive (HDD), and a solid state drive (SSD). Memory 110 may include any combination of readable and/or writable volatile memories and/or non-volatile memories, along with other possible storage devices.

The roadmap component 135 may generate a roadmap by selecting a path through topics (e.g., an outline) based upon the ordering of the topics and suggesting a structured path to the user.

Named entity component 115 may facilitate the building the co-occurrence graph by extracting the plurality of named entities from a corpus of information (e.g., text). The named entities extracted by the named entity component 115 may be used herein to refer to terms and/or topics in the one or more corpora of information (e.g., text). Named entity component 115 may also generate a set of equivalence classes for the set of candidate terms based on a synonym list, where each of the named entities corresponds to an equivalence class from the set of equivalence classes. In some examples, each of the named entities includes an information topic and/or term. In some examples, the one or more corpora of information (e.g., text) may comprises one or more unstructured corpora of information.

Named entity component 115 may extract a set of named entities from one or more corpora of information. Named entity component 115 may also identify a subset of the named entities, where the subset includes each of the named entities that lie within a threshold distance (e.g., a k hop neighborhood) of the target topic. For example, a maximum number of hops may refer to the number of intervening named entities between a named entity and the target topic and may describe an outer remoteness of relevance.

Graph component 120 may construct a graph based upon the extracted named entities. Graph component 120 may also identify a frequency count for each of the individual named entities. A co-occurrence count for each unordered pair of the named entities may be identified by the graph component 120. Graph component 120 may also identify a conditional probability for each ordered pair of the named entities based upon the frequency counts and the co-occurrence counts, where edges of the graph correspond to the conditional probabilities.

In other words, graph component 120 may build a graph based on the co-occurrence frequencies of pairs of named entities. For example, graph component 120 may identify a co-occurrence instance of a pair of named entities. Graph component 120 may then set a co-occurrence frequency of the pair of named entities to one if the pair of named entities is not present in a list of unordered pairs of named entities. Graph component 120 may also increment the co-occurrence frequency of the pair of named entities if the pair of named entities is present in the list of unordered pairs of named entities. Graph component 120 may also increment an individual frequency of each named entity in the pair of named entities.

In order to calculate co-occurrence frequencies, each of the named entities may be paired with each other named entity of the plurality of named entities. For every unordered pair of named entities extracted that occur within the same document, say a,b, the pair is inserted into the co-occurrence graph. If {a,b} is already present in the graph, get its co-occurrence frequency c(a,b) (where c(a,b) is an attribute of the non-directed edge representing the co-occurrence of a and b), set c(a,b)=c(a,b)+1. Also, take the frequencies f(a) and f(b) of a and b, and set f(a)=f(a)+1, and f(b)=f(b)+1. If a,b is not present in the graph, set c=1. Then get the frequencies f(a) and f(b) of a and b (assume the value of f for the corresponding node to be 0), and set f(a)=f(a)+1, and f(b)=f(b)+1.

In some examples, the graph includes conditional probabilities of the pairs of named entities (which can be viewed as the directed edges of the graph). Each of the conditional probabilities includes a ratio of a co-occurrence frequency and an individual frequency. For example, once the co-occurrence graph is built as described above, conditional probabilities of co-occurrence are determined as follows: P(b|a)=c(a,b)/f(a). Thus, in some examples, building the graph includes identifying directed edges between the pairs of named entities. Each of the directed edges corresponds to one of the conditional probabilities. Subgraph component 125 may connect directed edges between all named entity pairs in a subset of the graph.

The second part of the architecture of the present inventive concept involves reasoning on the graph. Subgraph component 125 may induce a subgraph from the graph based on a target named entity, where the subgraph includes a subset of the named entities. Subgraph component 125 may also identify the target named entity from among the named entities. For example, given a target topic chosen by the user, a subgraph is induced on the target topic as follows: pick all nodes or topics within a k-hop neighborhood of the target topic (this set may be referred to as N), and add the target topic to N. Subgraph component 125 may identify each of the named entities within a k-hop neighborhood of the target topic to form a set and select a maximum number of hops. Subgraph component 125 may also adjust a k value of the k-hop neighborhood, which may alter a degree of detail in the learning roadmap. Subgraph component 125 may also identify the subset of the named entities based upon whether each of the named entities lies within the maximum number of hops in the graph. Subgraph component 125 may also add the target topic itself to the set. Thus, subgraph component 125 may induce a subgraph for a target topic using the built graph.

Ordering component 130 may order the subset of the named entities based on the subgraph. Ordering component 130 may also identify an adjacency matrix, where entries of the adjacency matrix correspond to edges of the subgraph. Ordering component 130 may multiply the adjacency matrix by a transpose of the adjacency matrix to produce a product matrix. Ordering component 130 may then identify an eigenvector of the product matrix.

Based on the eigenvectors, ordering component 130 may identify a basic-ness value or an advanced-ness value for each named entity in the subset of named entities based on values of the eigenvector, where the ordering is based on the basic-ness values or the advanced-ness values. In some examples, ordering the subset includes ranking each named entity in the subset in descending order beginning with a named entity associated with a highest basic-ness value, or in ascending order beginning a named entity associated with a lowest advanced-ness value.

In some embodiments, ordering component 130 may generate an adjacency matrix, where entries of the adjacency matrix correspond to edges of the graph. For example, directed edges may be connected between all pairs of nodes (a,b) in N according to the adjacency matrix E defined by E[a,b]=P(b|a). For a given node a, one may define E[a,a]=0. Ordering component 130 may multiply the adjacency matrix by a transpose of the adjacency matrix to produce a product matrix (i.e., $E^T E$ or $EE^T$). Ordering component 130 may identify eigenvector(s) of the product matrix, and order one or more of the named entities based on the values of the eigenvector. Thus, ordering component 130 may determine a rank of at least one of basic-ness and advanced-ness for each of the named entities in relation to the target topic.

Given a contextual subgraph as described above, a topic may be defined as advanced if a large number of basic topics are mentioned in the context of the topic. Likewise, a topic is defined to be basic if it is mentioned in the context of a large number of advanced topics. Every topic will have an element of basic-ness and an element of advanced-ness. A topic that is basic in the context of one topic may be advanced in the context of another topic. The basic-ness score as well as an advanced-ness score are computed for each named entity. Vectors A and B are defined, each of length n. Here, n is the total number of topics in the induced subgraph of the target topic. A will represent the advanced-ness score of each named entity, while vector B will represent the basic-ness score of each named entity. For every topic t, we initialize A[t]=B[t]=1/n (i.e. a uniform probability distribution).

The initial vectors for A and B can be set to a probability distribution. This will not impact the final advanced-ness scores and basic-ness scores because mode computation is performed for basic-ness and advanced-ness scores as power iterations. Keeping with the above definitions of advanced-ness and basic-ness of topic, we can state the following equations:

$$A = EB \quad (1)$$

$$B = E^T A \quad (2)$$

The value of A from Equation (1) is inserted into Equation (2), to yield Equation (3):

$$B = E^T EB \quad (3)$$

Next, the value of B from Equation (2) is inserted into Equation 1 to yield Equation (4):

$$A = E E^T A \quad (4)$$

Equation (3) as well as Equation (4) represent power iterations. In Equation (3), B converges to the principal eigenvector of $E^T E$. Equation (4) A converges to the principal eigenvector of $EE^T$. In practice, the power iterations in Equations (3) and (4) can be stopped once the ordering of nodes in both processes stabilizes. The advanced-ness and basic-ness scores themselves may change thereafter but the relative ordering of the nodes/topics does not change.

Roadmap component 135 may generate a learning roadmap for the target named entity based on the ordering. In some examples, the generating a learning roadmap includes generating a recommended order for learning information associated with the subset of named entities.

In some examples, the ordering the named entities includes generating a learning roadmap to the target topic using the determined rank of at least one of basic-ness and advanced-ness. The learning roadmap of topics for the given target topic can be determined, for example, according to one of the following two approaches: 1) ordering the named entities in the induced subgraph of the target topic in the decreasing order of basic-ness scores, or 2) ordering the named entities in the induced subgraph of the target topic in the increasing order of advanced-ness scores.

In the first approach, the user is presented with a roadmap of named entities starting from the named entity with the highest basic-ness score and leading up to the target topic. In the second approach, the user is presented with a roadmap of named entities starting from the topic with the lowest advanced-ness score and leading up to the target topic.

Figure 2:
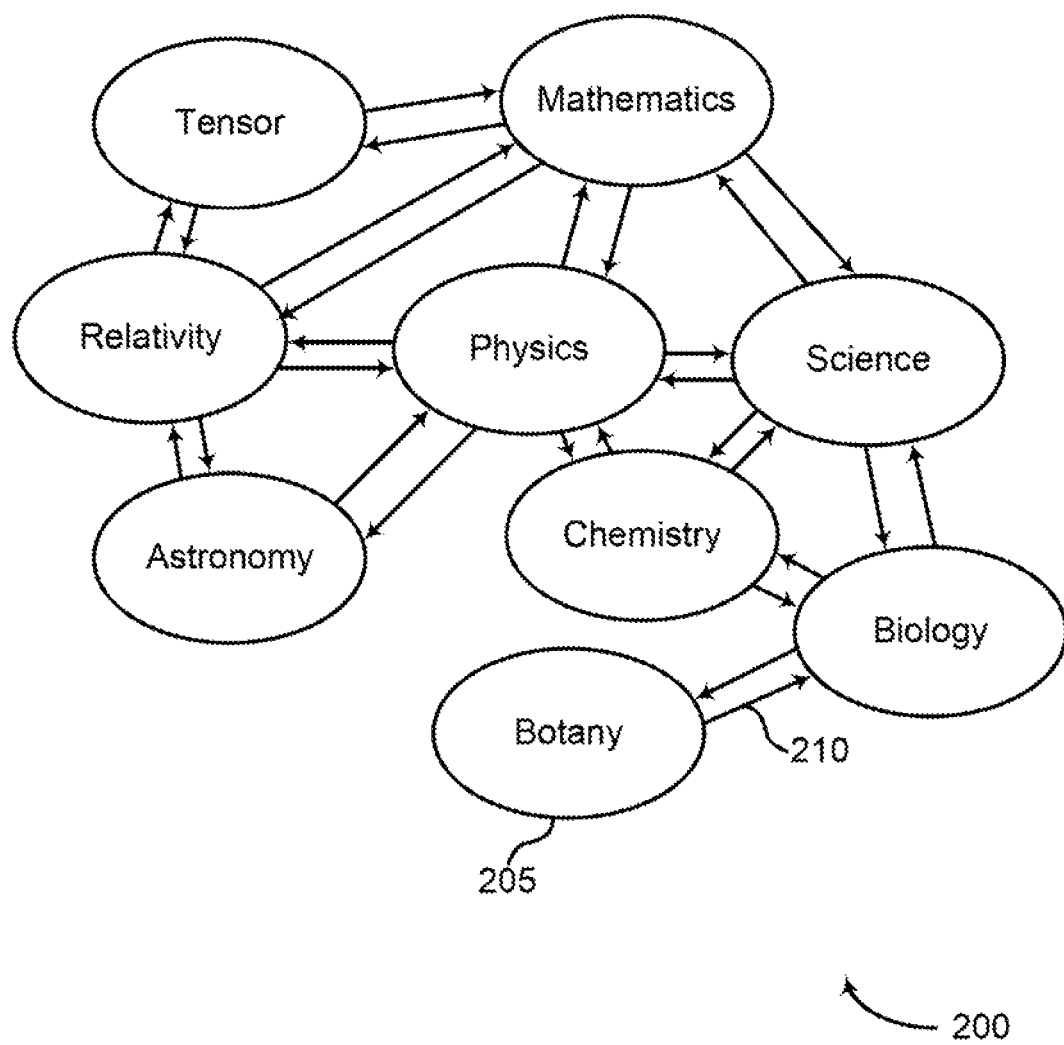
FIG. 2 shows an example of a named entity graph in accordance with aspects of the present disclosure.

FIG. 2 shows an example of a named entity graph 200 in accordance with aspects of the present disclosure. The named entity graph 200 may include a plurality of topics or named entities 205, connected by directed edges 210 that correspond to the conditional probabilities of the co-occurrence of the named entities 205 as described herein. Once the directed edges 210 are identified, the topics may be ordered, and a learning roadmap may be generated based on the ordering.

Figure 3:
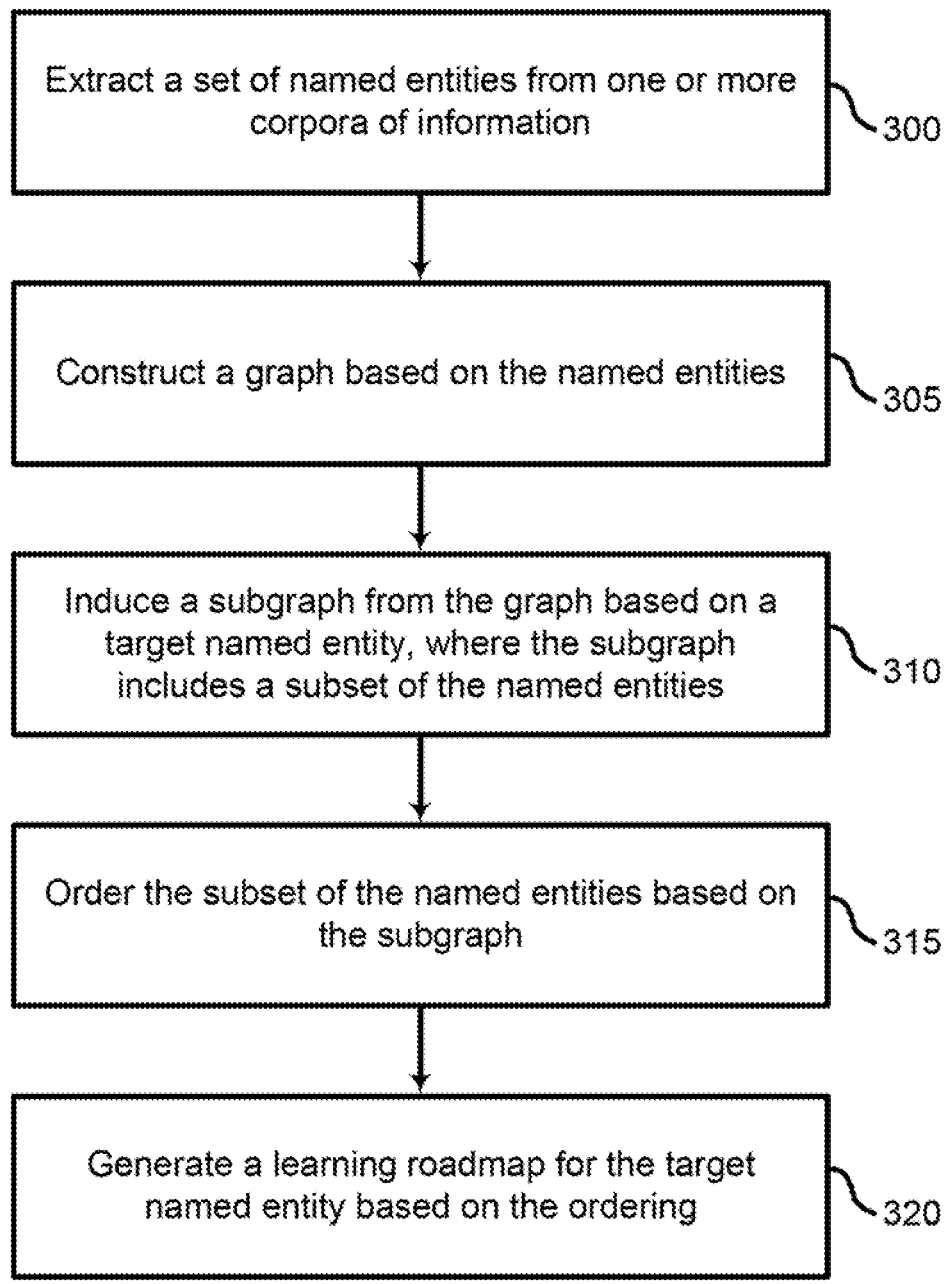
FIG. 3 shows an example of a process for generating learning roadmaps from unstructured information in accordance with aspects of the present disclosure.

FIG. 3 shows an example of a process for generating learning roadmaps from unstructured information in accordance with aspects of the present disclosure. In some examples, these operations may be performed by a processor executing a set of codes to control functional elements of an apparatus. Additionally or alternatively, the processes may be performed using special-purpose hardware. Generally, these operations may be performed according to the methods and processes described in accordance with aspects of the present disclosure. For example, the operations may be composed of various substeps, or may be performed in conjunction with other operations described herein.

At step 300, the system extracts a set of named entities from one or more corpora of information. In some cases, the operations of this step may refer to, or be performed by, a named entity component as described with reference to FIG. 1. In some cases, extracting a set of named entities may include extracting a set of terms in the one or more corpora of information and generating a set of equivalence classes of the set of candidate terms based on a synonym list, wherein each of the named entities corresponds to an equivalence class from the set of equivalence classes.

At step 305, the system constructs a graph and/or matrix based on the named entities. In some cases, the operations of this step may refer to, or be performed by, a graph component as described with reference to FIG. 1. In some examples, constructing the graph may include identifying a frequency count for each of the named entities, identifying a co-occurrence count for each unordered pair of the named entities; and identifying a conditional probability for each ordered pair of the named entities based on the frequency counts and the co-occurrence counts, wherein edges of the graph correspond to the conditional probabilities.

At step 310, the system induces a subgraph from the graph based on a target named entity, where the subgraph includes a subset of the named entities. In some cases, the operations of this step may refer to, or be performed by, a subgraph component as described with reference to FIG. 1. In some cases, inducing the subgraph may include identifying the target named entity (i.e., the target topic) from among the named entities. According to an exemplary embodiment of the present inventive concept, the subgraph may help determine a previously unidentified target topic, which represents the most advanced or least basic topic amongst the named entities. The system may select a maximum number of hops for the subgraph and identify the subset of the named entities based on whether each of the named entities lies within the designated maximum number of hops in the graph.

At step 315, the system orders the subset of the named entities based on the subgraph. In some cases, the operations of this step may refer to, or be performed by, an ordering component as described with reference to FIG. 1. In some cases, ordering the subset may include identifying an adjacency matrix, wherein entries of the adjacency matrix correspond to edges of the subgraph, multiplying the adjacency matrix by a transpose of the adjacency matrix to produce a product matrix (i.e., $E^TE$ or $EE^T$), identifying an eigenvector of the product matrix, and identifying a basic-ness value or an advanced-ness value for each named entity in the subset of named entities based on values of the eigenvector, wherein the ordering is based on the basic-ness values or the advanced-ness values.

At step 320, the system generates a learning roadmap for the target named entity based on the ordering. In some cases, the operations of this step may refer to, or be performed by, a roadmap component as described with reference to FIG. 1. In some cases, generating the roadmap may include collecting the set of topics in the subgraph, and presenting a path for learning the topics based on the ordering. In some cases, the path may be represented to the user visually. In other cases, text from the unstructured text may be collected and presented to the user (e.g., in outline form).

Figure 4:
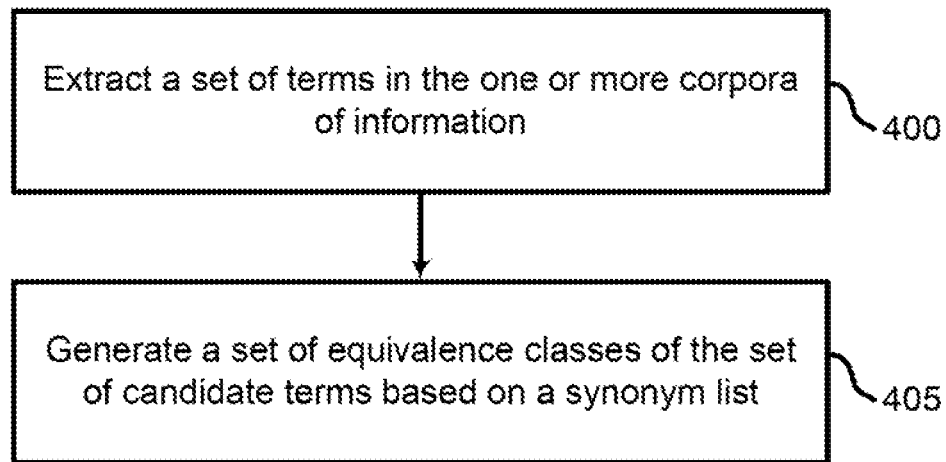
FIG. 4 shows an example of a process for extracting named entities in accordance with aspects of the present disclosure.

FIG. 4 shows an example of a process for extracting named entities in accordance with aspects of the present disclosure. In some examples, these operations may be performed by a processor executing a set of codes to control functional elements of an apparatus. Additionally or alternatively, the processes may be performed using special-purpose hardware. Generally, these operations may be performed according to the methods and processes described in accordance with aspects of the present disclosure. For example, the operations may be composed of various substeps, or may be performed in conjunction with other operations described herein.

At step 400, the system extracts a set of terms in the one or more corpora of information. The extracted terms may be singular words and/or phrases that are associated with related topics. In some cases, the operations of this step may refer to, or be performed by, a named entity component as described with reference to FIG. 1.

At step 405, the system generates a set of equivalence classes for the set of candidate terms based on a synonym list. For example, the equivalence classes may include synonyms and/or approximate phrases that correspond to the candidate terms. In some cases, the operations of this step may refer to, or be performed by, a named entity component as described with reference to FIG. 1.

Figure 5:
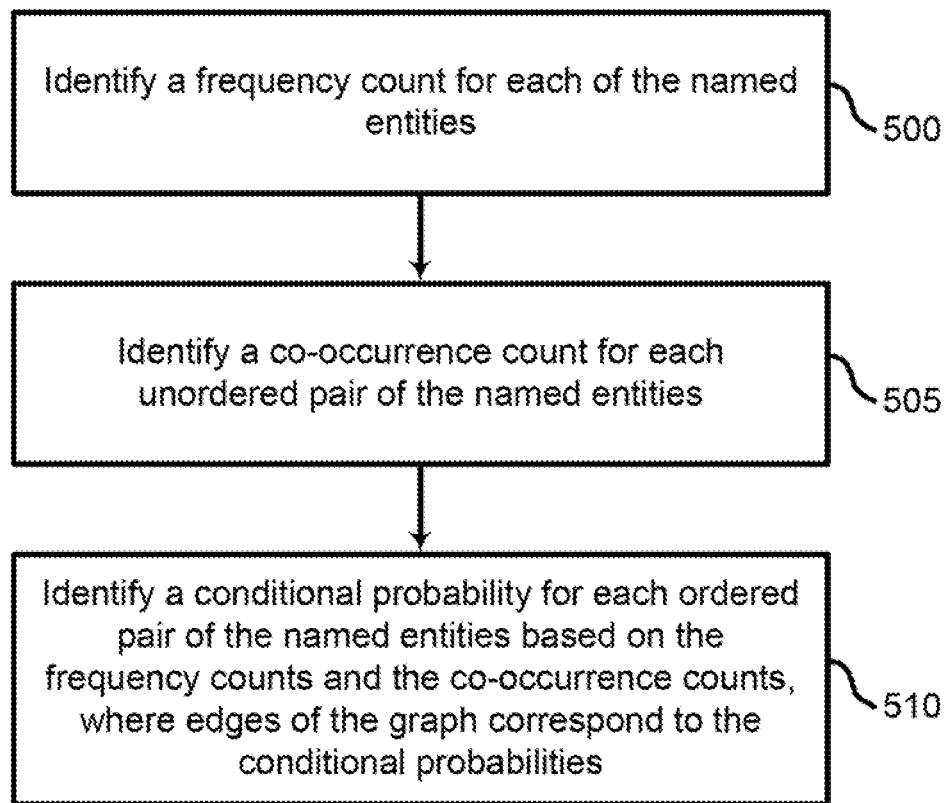
FIG. 5 shows an example of a process for constructing a graph in accordance with aspects of the present disclosure.

FIG. 5 shows an example of a process for constructing a graph in accordance with aspects of the present disclosure. In some examples, these operations may be performed by a processor executing a set of codes to control functional elements of an apparatus. Additionally or alternatively, the processes may be performed using special-purpose hardware. Generally, these operations may be performed according to the methods and processes described in accordance with aspects of the present disclosure. For example, the operations may be composed of various substeps, or may be performed in conjunction with other operations described herein.

At step 500, the system identifies a frequency count for each of the extracted named entities. For example, each instance of a named entity contained in a corpora of information results in a corresponding increment to the named entity's frequency. In some cases, the operations of this step may refer to, or be performed by, a graph component as described with reference to FIG. 1.

At step 505, the system identifies a co-occurrence count for each unordered pair of the named entities. In some cases, the operations of this step may refer to, or be performed by, a graph component as described with reference to FIG. 1. For example, every unordered pair of named entities extracted that occur within the same document, say {a,b}, the pair is inserted into the co-occurrence graph using the following method: if {a,b} is already present in the graph get its co-occurrence frequency c(a,b) (here, c(a,b) is an attribute of the edge representing the co-occurrence of a and b), set c(a,b)=c(a,b)+1, get the frequencies f(a) and f(b) of a and b, and set f(a)=f(a)+1, and f(b)=f(b)+1.

If {a,b} is not present in the graph: set c=1, get the frequencies f(a) and f(b) of a and b (assume the value of f for the corresponding node to be 0), and set f(a)=f(a)+1, and f(b)=f(b)+1.

At step 510, the system identifies a conditional probability for each ordered pair of the named entities based on the frequency counts and the co-occurrence counts. The sensitivity parameter of co-occurrence may be varied, and/or the parameters themselves. For example, the parameters may non-exhaustively include a predetermined nearness of words, paragraphs, or pages, and the sensitivity may refer to the range permitted. Edges of the graph correspond to the conditional probabilities. In some cases, the operations of this step may refer to, or be performed by, a graph component as described with reference to FIG. 1. For example, once the co-occurrence graph is built as described above, conditional probabilities of co-occurrence are determined by P(b|a)=c(a,b)/f(a).

Figure 6:
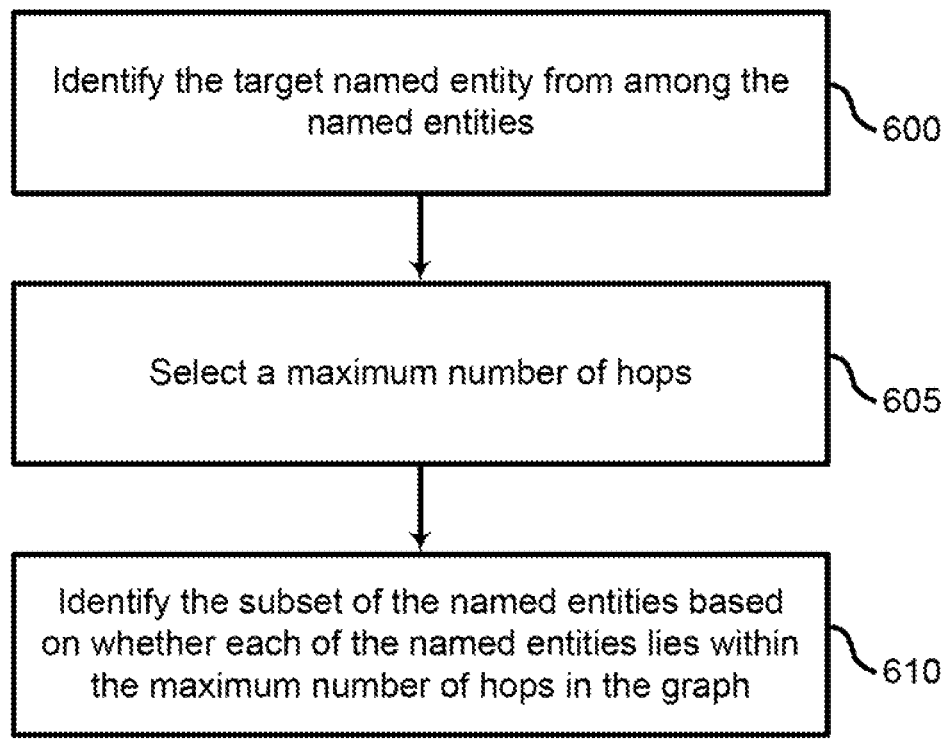
FIG. 6 shows an example of a process for inducing a subgraph in accordance with aspects of the present disclosure.

FIG. 6 shows an example of a process for inducing a subgraph in accordance with aspects of the present disclosure. In some examples, these operations may be performed by a processor executing a set of codes to control functional elements of an apparatus. Additionally or alternatively, the processes may be performed using special-purpose hardware. Generally, these operations may be performed according to the methods and processes described in accordance with aspects of the present disclosure. For example, the operations may be composed of various substeps, or may be performed in conjunction with other operations described herein.

At step 600, the system identifies the target named entity from among the named entities. However, the inventive concept is not limited thereto. In some cases, the operations of this step may refer to, or be performed by, a subgraph component as described with reference to FIG. 1. For example, given a target topic chosen by the user, a subgraph is induced on the target topic as follows: pick all nodes/topics within a k-hop neighborhood of the target topic (this set may be referred to as N), add the target topic to N, and connect directed edges between all pairs of nodes (a,b) in N according to the adjacency matrix E defined by E[a,b]=P(b|a). For a given node a, we define E[a,a]=0.

At step 605, the system selects a maximum number of hops. In some cases, the operations of this step may refer to, or be performed by, a subgraph component as described with reference to FIG. 1. For example, a maximum number of hops may refer to the number of intervening named entities tolerated between a named entity and the target topic, and may describe an outer remoteness boundary of relevance. According to an exemplary embodiment of the present inventive concept, the user may manually select the maximum number of hops, or select a desired degree of relevance which may correspond to a system determined percentage of relevance. For example, the percentage of relevance may range from a most remote topic of the plurality of topics (i.e., a least relevant topic to a target topic) to a penultimate topic (i.e., a most immediately relevant topic to a target topic). Although only exemplary, using relevance as a metric facilitates user utilization of the subgraph.

At step 610, the system identifies the subset of the named entities based on whether each of the named entities lies within the maximum number of hops in the graph. For example, the subset of the named entities may be determined based on a selected relevance range, as may be determined in step 605. In some cases, the operations of this step may refer to, or be performed by, a subgraph component as described with reference to FIG. 1.

Figure 7:
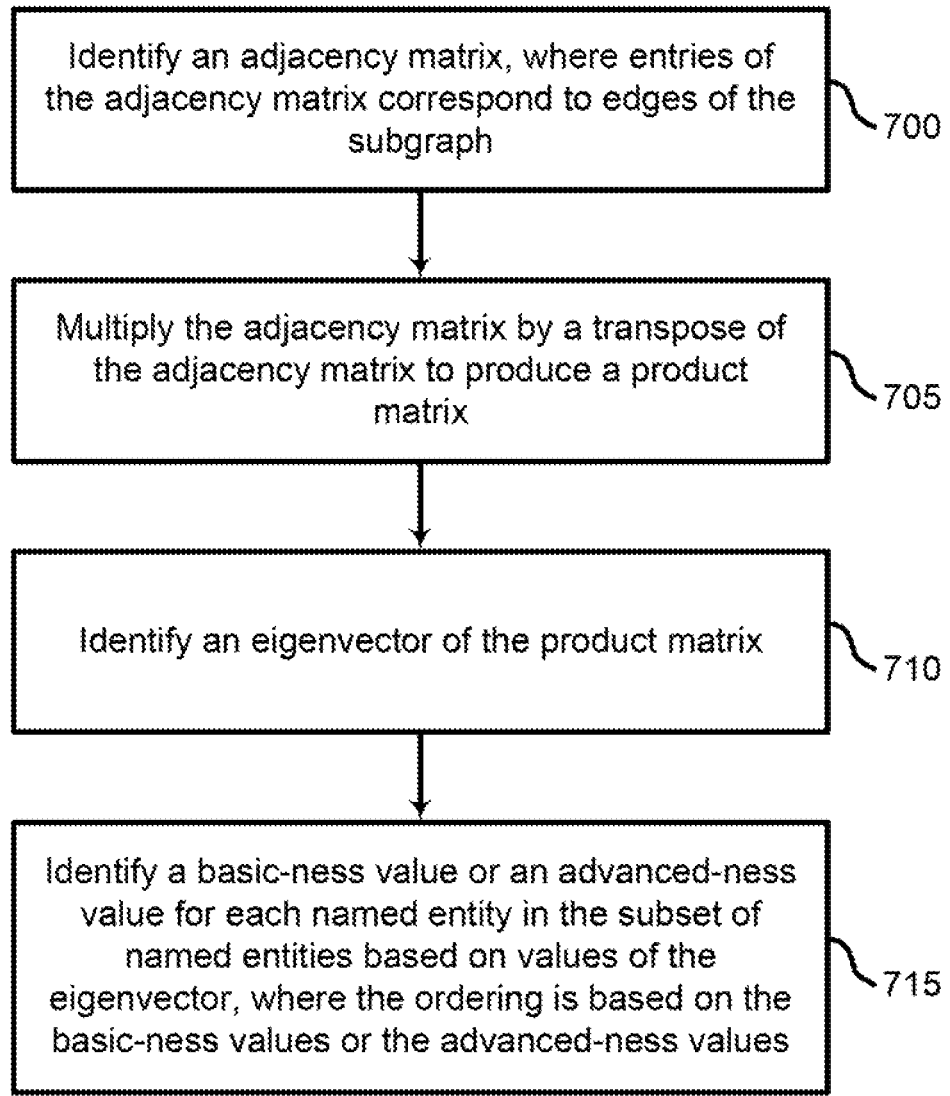
FIG. 7 shows an example of a process for ordering named entities in accordance with aspects of the present disclosure.

FIG. 7 shows an example of a process for ordering named entities in accordance with aspects of the present disclosure. In some examples, these operations may be performed by a processor executing a set of codes to control functional elements of an apparatus. Additionally or alternatively, the processes may be performed using special-purpose hardware. Generally, these operations may be performed according to the methods and processes described in accordance with aspects of the present disclosure. For example, the operations may be composed of various substeps, or may be performed in conjunction with other operations described herein.

At step 700, the system identifies an adjacency matrix, where entries of the adjacency matrix correspond to edges of the subgraph. In some cases, the operations of this step may refer to, or be performed by, an ordering component as described with reference to FIG. 1. For example, a subgraph is induced on the target topic as follows: pick all nodes/topics within a k-hop neighborhood of the target topic (this set may be referred to as N), add the target topic to N, and connect directed edges between all pairs of nodes (a,b) in N according to the adjacency matrix E defined by E[a,b]=P(b|a). For a given node a, we define E[a,a]=0.

At step 705, the system multiplies the adjacency matrix by a transpose of the adjacency matrix to produce a product matrix (i.e., $E^T E$ or $EE^T$). In some cases, the operations of this step may refer to, or be performed by, an ordering component as described with reference to FIG. 1.

At step 710, the system identifies an eigenvector of the product matrix. In some cases, the operations of this step may refer to, or be performed by, an ordering component as described with reference to FIG. 1. For example, At step 715, the system identifies a basic-ness value or an advanced-ness value for each named entity in the subset of named entities based on values of the eigenvector, where the ordering is based on the basic-ness values or the advanced-ness values. In some cases, the operations of this step may refer to, or be performed by, an ordering component as described with reference to FIG. 1.

For example, the basic-ness score as well as an advanced-ness score are calculated for each named entity. Vectors A and B are each include length n. Here, n represents the total number of topics within a k hop neighborhood of the induced subgraph of the target topic. A will define the advanced-ness score of each named entity, while vector B will define the basic-ness score of each named entity. For every topic t, we initialize a uniform probability distribution:

$$A[t] = B[t] = \frac{1}{n}.$$

The advanced-ness and basic-ness of a topic can be determined according to Equations 1 through 4 described above.

The learning roadmap of topics for the given target topic can be determined, for example, according to one of the following two approaches: 1) ordering the named entities in the induced subgraph of the target topic in the decreasing order of basic-ness scores, or 2) ordering the named entities in the induced subgraph of the target topic in the increasing order of advanced-ness scores.

Figure 8:
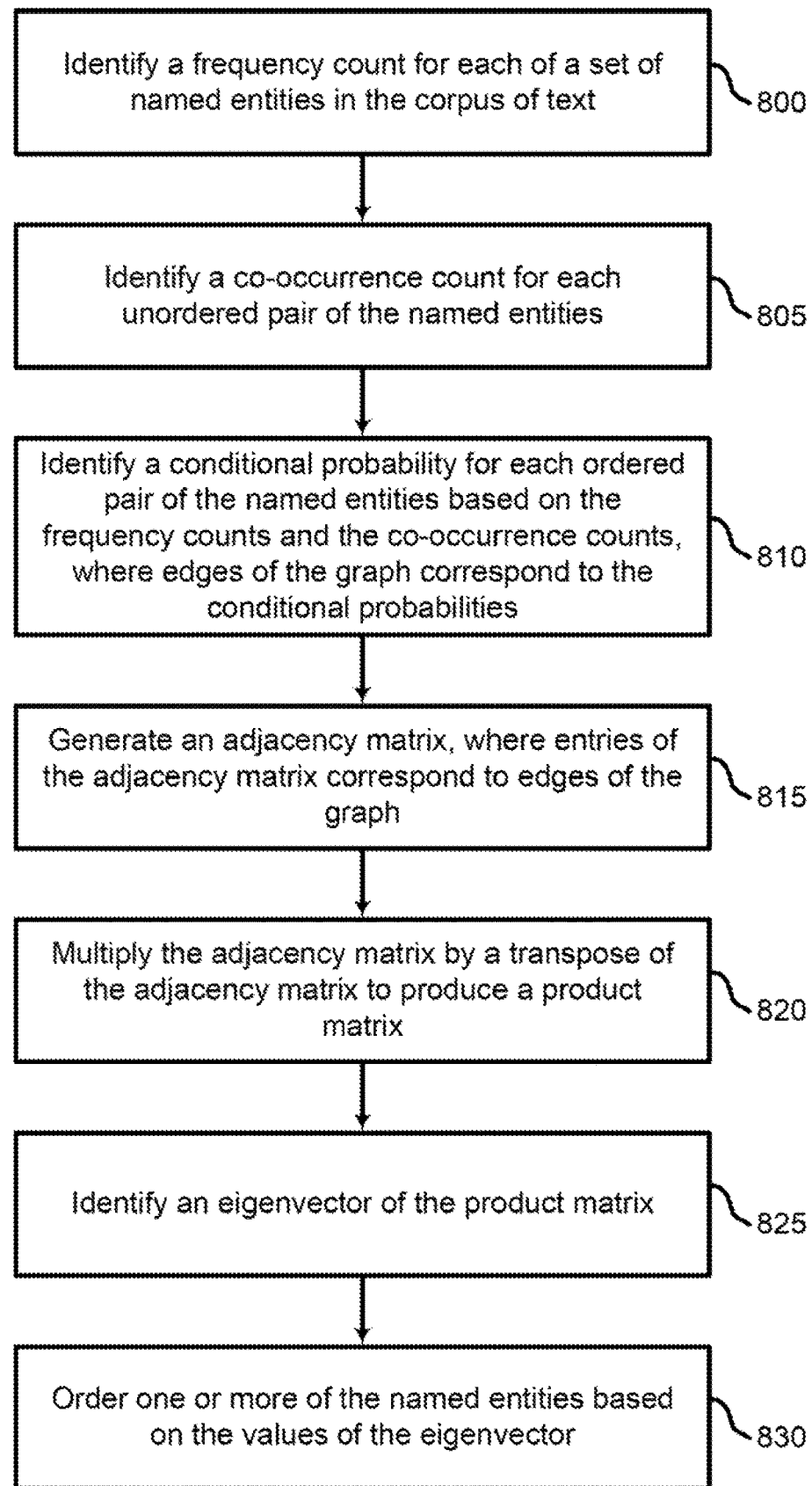
FIGS. 8 through 9 show examples of a process for generating learning roadmaps from unstructured information in accordance with aspects of the present disclosure.

FIG. 8 shows an example of a process for generating learning roadmaps from unstructured information in accordance with aspects of the present inventive concept. In some examples, these operations may be performed by a processor executing a set of codes to control functional elements of an apparatus. Additionally or alternatively, the processes may be performed using special-purpose hardware. Generally, these operations may be performed according to the methods and processes described in accordance with aspects of the present disclosure. For example, the operations may be composed of various substeps, or may be performed in conjunction with other operations described herein.

At step 800, the system identifies a frequency count for each of a set of named entities in the corpus of text. In some cases, the operations of this step may refer to, or be performed by, a graph component as described with reference to FIG. 1.

At step 805, the system identifies a co-occurrence count for each unordered pair of the named entities. In some cases, the operations of this step may refer to, or be performed by, a graph component as described with reference to FIG. 1.

At step 810, the system identifies a conditional probability for each ordered pair of the named entities based on the frequency counts and the co-occurrence counts, where edges of the graph correspond to the conditional probabilities. In some cases, the operations of this step may refer to, or be performed by, a graph component as described with reference to FIG. 1.

At step 815, the system generates an adjacency matrix, where entries of the adjacency matrix correspond to edges of the graph. In some cases, the operations of this step may refer to, or be performed by, an ordering component as described with reference to FIG. 1.

At step 820, the system multiplies the adjacency matrix by a transpose of the adjacency matrix to produce a product matrix (i.e., $E^T E$ or $EE^T$). In some cases, the operations of this step may refer to, or be performed by, an ordering component as described with reference to FIG. 1.

At step 825, the system identifies an eigenvector of the product matrix. In some cases, the operations of this step may refer to, or be performed by, an ordering component as described with reference to FIG. 1.

At step 830, the system orders one or more of the named entities based on the values of the eigenvector. In some cases, the operations of this step may refer to, or be performed by, an ordering component as described with reference to FIG. 1.

Figure 9:
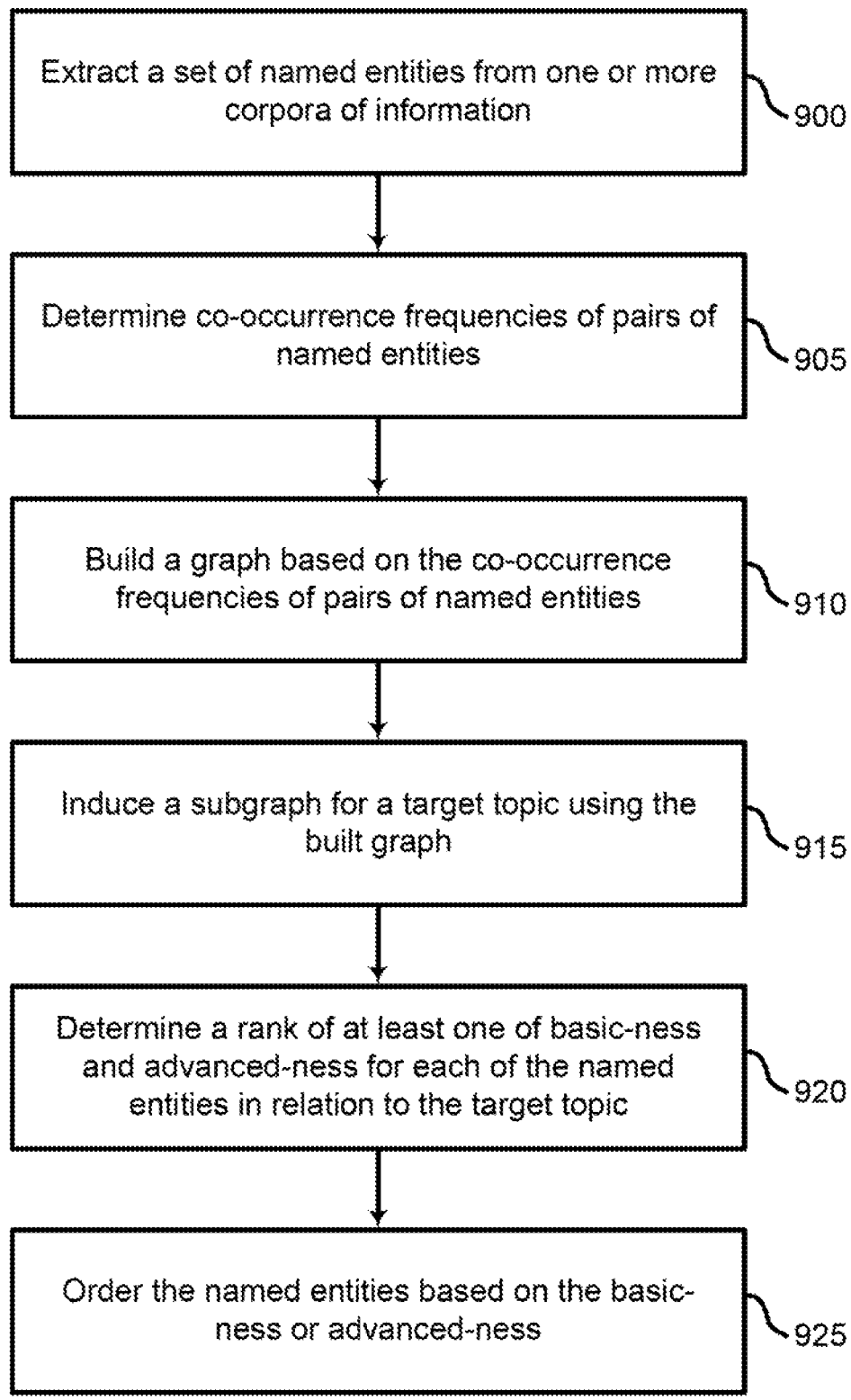

FIG. 9 shows an example of a process for generating learning roadmaps from unstructured information in accordance with aspects of the present disclosure. In some examples, these operations may be performed by a processor executing a set of codes to control functional elements of an apparatus. Additionally or alternatively, the processes may be performed using special-purpose hardware. Generally, these operations may be performed according to the methods and processes described in accordance with aspects of the present disclosure. For example, the operations may be composed of various substeps, or may be performed in conjunction with other operations described herein.

At step 900, the system extracts a set of named entities from one or more corpora of information. In some cases, the operations of this step may refer to, or be performed by, a named entity component as described with reference to FIG. 1.

At step 905, the system determines co-occurrence frequencies of pairs of named entities. In some cases, the operations of this step may refer to, or be performed by, a graph component as described with reference to FIG. 1.

At step 910, the system builds a graph based on the co-occurrence frequencies of pairs of named entities. In some cases, the operations of this step may refer to, or be performed by, a graph component as described with reference to FIG. 1.

At step 915, the system induces a subgraph for a target topic using the built graph. In some cases, the operations of this step may refer to, or be performed by, a subgraph component as described with reference to FIG. 1.

At step 920, the system determines a rank of at least one of basic-ness and advanced-ness for each of the named entities in relation to the target topic. In some cases, the operations of this step may refer to, or be performed by, an ordering component as described with reference to FIG. 1.

At step 925, the system orders the named entities based on the basic-ness or advanced-ness. In some cases, the operations of this step may refer to, or be performed by, an ordering component as described with reference to FIG. 1.

Accordingly, the present disclosure includes the following embodiments.

A method for generating learning roadmaps from unstructured information is described. The method may include extracting a plurality of named entities from one or more corpora of information, constructing a graph based on the named entities, inducing a subgraph from the graph based on a target named entity, wherein the subgraph includes a subset of the named entities, ordering the subset of the named entities based on the subgraph, and generating a learning roadmap for the target named entity based on the ordering.

An apparatus for generating learning roadmaps from unstructured information is described. The apparatus may include a processor, memory in electronic communication with the processor, and instructions stored in the memory. The instructions may be operable to cause the processor to extract a plurality of named entities from one or more corpora of information, construct a graph based on the named entities, induce a subgraph from the graph based on a target named entity, wherein the subgraph includes a subset of the named entities, order the subset of the named entities based on the subgraph, and generate a learning roadmap for the target named entity based on the ordering.

A non-transitory computer readable medium storing code for generating learning roadmaps from unstructured information is described. In some examples, the code comprises instructions executable by a processor to: extract a plurality of named entities from one or more corpora of information, construct a graph based on the named entities, induce a subgraph from the graph based on a target named entity, wherein the subgraph includes a subset of the named entities, order the subset of the named entities based on the subgraph, and generate a learning roadmap for the target named entity based on the ordering.

Some examples may further include extracting a set of terms in the one or more corpora of information. Some examples may further include generating a set of equivalence classes of the set of candidate terms based on a synonym list, wherein each of the named entities corresponds to an equivalence class from the set of equivalence classes.

Some examples of the method, apparatus, and non-transitory computer readable medium described above may further include identifying a frequency count for each of the named entities. Some examples may further include identifying a co-occurrence count for each unordered pair of the named entities. Some examples may further include identifying a conditional probability for each ordered pair of the named entities based on the frequency counts and the co-occurrence counts, wherein edges of the graph correspond to the conditional probabilities.

Some examples of the method, apparatus, and non-transitory computer readable medium described above may further include identifying the target named entity from among the named entities. Some examples may further include selecting a maximum number of hops. Some examples may further include identifying the subset of the named entities based on whether each of the named entities lies within the maximum number of hops in the graph.

Some examples of the method, apparatus, and non-transitory computer readable medium described above may further include identifying an adjacency matrix, wherein entries of the adjacency matrix correspond to edges of the subgraph. Some examples may further include multiplying the adjacency matrix by a transpose of the adjacency matrix to produce a product matrix (i.e., $E^T E$ or $EE^T$). Some examples may further include identifying an eigenvector of the product matrix. Some examples may further include identifying a basic-ness value or an advanced-ness value for each named entity in the subset of named entities based on values of the eigenvector, wherein the ordering is based on the basic-ness values or the advanced-ness values.

In some examples, the ordering the subset includes ranking each named entity in the subset in descending order beginning with a named entity associated with a highest basic-ness value, or in ascending order beginning a named entity associated with a lowest advanced-ness value. In some examples, the generating a learning roadmap comprises generating a recommended order for learning information associated with the subset of named entities. In some examples, each of the named entities comprises an information topic. In some examples, the one or more corpora of information comprise unstructured corpora of information.

A method for generating learning roadmaps from unstructured information is described. The method may include identifying a frequency count for each of a plurality of named entities in the corpus of text, identifying a co-occurrence count for each unordered pair of the named entities, identifying a conditional probability for each ordered pair of the named entities based on the frequency counts and the co-occurrence counts, wherein edges of the graph correspond to the conditional probabilities, generating an adjacency matrix, wherein entries of the adjacency matrix correspond to edges of the graph, multiplying the adjacency matrix by a transpose of the adjacency matrix to produce a product matrix, identifying an eigenvector of the product matrix, and ordering one or more of the named entities based on the values of the eigenvector.

An apparatus for generating learning roadmaps from unstructured information is described. The apparatus may include a processor, memory in electronic communication with the processor, and instructions stored in the memory. The instructions may be operable to cause the processor to identify a frequency count for each of a plurality of named entities in the corpus of text, identify a co-occurrence count for each unordered pair of the named entities, identify a conditional probability for each ordered pair of the named entities based on the frequency counts and the co-occurrence counts, wherein edges of the graph correspond to the conditional probabilities, generate an adjacency matrix, wherein entries of the adjacency matrix correspond to edges of the graph, multiply the adjacency matrix by a transpose of the adjacency matrix to produce a product matrix, identify an eigenvector of the product matrix, and order one or more of the named entities based on the values of the eigenvector.

A non-transitory computer readable medium storing code for generating learning roadmaps from unstructured information is described. In some examples, the code comprises instructions executable by a processor to: identify a frequency count for each of a plurality of named entities in the corpus of text, identify a co-occurrence count for each unordered pair of the named entities, identify a conditional probability for each ordered pair of the named entities based on the frequency counts and the co-occurrence counts, wherein edges of the graph correspond to the conditional probabilities, generate an adjacency matrix, wherein entries of the adjacency matrix correspond to edges of the graph, multiply the adjacency matrix by a transpose of the adjacency matrix to produce a product matrix, identify an eigenvector of the product matrix, and order one or more of the named entities based on the values of the eigenvector.

Some examples of the method, apparatus, and non-transitory computer readable medium described above may further include generating a learning roadmap for a target topic based on the ordering, wherein the target topic comprises one of the named entities. Some examples of the method, apparatus, and non-transitory computer readable medium described above may further include identifying a subset of the named entities, wherein the subset includes each of the named entities that lies within a threshold distance of the target topic.

Some examples of the method, apparatus, and non-transitory computer readable medium described above may further include identifying each of the named entities within a k-hop neighborhood of the target topic to form a set. Some examples may further include adding the target topic to the set. Some examples may further include connecting directed edges between all named entity pairs in the set.

A method for generating learning roadmaps from unstructured information is described. The method may include extracting a plurality of named entities from one or more corpora of information, determining co-occurrence frequencies of pairs of named entities, building a graph based on the co-occurrence frequencies of pairs of named entities, inducing a subgraph for a target topic using the built graph, determining a rank of at least one of basic-ness and advanced-ness for each of the named entities in relation to the target topic, and ordering the named entities based on the basic-ness or advanced-ness.

An apparatus for generating learning roadmaps from unstructured information is described. The apparatus may include a processor, memory in electronic communication with the processor, and instructions stored in the memory. The instructions may be operable to cause the processor to extract a plurality of named entities from one or more corpora of information, determine co-occurrence frequencies of pairs of named entities, build a graph based on the co-occurrence frequencies of pairs of named entities, induce a subgraph for a target topic using the built graph, determine a rank of at least one of basic-ness and advanced-ness for each of the named entities in relation to the target topic, and order the named entities based on the basic-ness or advanced-ness.

A non-transitory computer readable medium storing code for generating learning roadmaps from unstructured information is described. In some examples, the code comprises instructions executable by a processor to: extract a plurality of named entities from one or more corpora of information, determine co-occurrence frequencies of pairs of named entities, build a graph based on the co-occurrence frequencies of pairs of named entities, induce a subgraph for a target topic using the built graph, determine a rank of at least one of basic-ness and advanced-ness for each of the named entities in relation to the target topic, and order the named entities based on the basic-ness or advanced-ness.

In some examples, the ordering the named entities includes generating a learning roadmap to the target topic using the determined rank of at least one of basic-ness and advanced-ness.

Some examples of the method, apparatus, and non-transitory computer readable medium described above may further include identifying a co-occurrence instance of a pair of named entities. Some examples may further include setting a co-occurrence frequency of the pair of named entities to one if the pair of named entities is not present in a list of unordered pairs of named entities. Some examples may further include incrementing the co-occurrence frequency of the pair of named entities if the pair of named entities is present in the list of unordered pairs of named entities. Some examples may further include incrementing an individual frequency of each named entity in the pair of named entities.

Some examples of the method, apparatus, and non-transitory computer readable medium described above may further include adjusting a k value of the k-hop neighborhood to alter a degree of detail in the learning roadmap. In some examples, the graph includes conditional probabilities of the pairs of named entities, and wherein each of the conditional probabilities comprises a ratio of a co-occurrence frequency and an individual frequency. In some examples, the building the graph comprises identifying directed edges between the pairs of named entities, wherein each of the directed edges corresponds to one of the conditional probabilities.

Some examples of the method, apparatus, and non-transitory computer readable medium described above may further include generating an adjacency matrix, wherein the entries of the adjacency matrix include the conditional probabilities. Some examples may further include generating a product matrix by multiplying the adjacency matrix by a transpose of the adjacency matrix. Some examples may further include identifying an eigenvector of the product matrix, wherein the ordering is based on eigenvalues of the eigenvector.

The described methods may be implemented or performed by devices that include a general-purpose processor, a digital signal processor (DSP), an application specific integrated circuit (ASIC), a field programmable gate array (FPGA) or other programmable logic device, discrete gate or transistor logic, discrete hardware components, or any combination thereof. A general-purpose processor may be a microprocessor, a conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration). Thus, the functions described herein may be implemented in hardware or software and may be executed by a processor, firmware, or any combination thereof. If implemented in software executed by a processor, the functions may be stored in the form of instructions or code on a computer-readable medium.

Computer-readable media includes both non-transitory computer storage media and communication media including any medium that facilitates transfer of code or data. A non-transitory storage medium may be any available medium that can be accessed by a computer. For example, non-transitory computer-readable media can comprise random access memory (RAM), read-only memory (ROM), electrically erasable programmable read-only memory (EEPROM), compact disk (CD) or other optical disk storage, magnetic disk storage, or any other non-transitory medium for carrying or storing data or code.

Also, connecting components may be properly termed computer-readable media. For example, if code or data is transmitted from a website, server, or other remote source using a coaxial cable, fiber optic cable, twisted pair, digital subscriber line (DSL), or wireless technology such as infrared, radio, or microwave signals, then the coaxial cable, fiber optic cable, twisted pair, DSL, or wireless technology are included in the definition of medium. Combinations of media are also included within the scope of computer-readable media.

In this disclosure and the following claims, the word "or" indicates an inclusive list such that, for example, the list of X, Y, or Z means X or Y or Z or XY or XZ or YZ or XYZ. Also the phrase "based on" is not used to represent a closed set of conditions. For example, a step that is described as "based on condition A" may be based on both condition A and condition B. In other words, the phrase "based on" shall be construed to mean "based at least in part on."

The description and drawings described heretofore represent example configurations and do not represent all the implementations within the scope of the claims. For example, the operations and steps may be rearranged, combined or otherwise modified. Also, structures and devices may be represented in the form of block diagrams to represent the relationship between components and avoid obscuring the described concepts. Similar components or features may have the same name but may have different reference numbers corresponding to different figures.

Some modifications to the disclosure may be readily apparent to those skilled in the art, and the principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for learning roadmaps, comprising:
   extracting a plurality of named entities from one or more corpora of information;
   constructing a graph based on the named entities;
   inducing a subgraph from the graph based on a target named entity, wherein the subgraph includes a subset of the named entities;
   identifying an adjacency matrix, wherein entries of the adjacency matrix correspond to edges of the subgraph;
   multiplying the adjacency matrix by a transpose of the adjacency matrix to produce a product matrix;
   identifying an eigenvector of the product matrix;
   identifying a basic-ness value or an advanced-ness value for each named entity in the subset of named entities based on values of the eigenvector, wherein the ordering is based on the basic-ness values or the advanced-ness values;
ordering the subset of the named entities based on the subgraph; and
generating a learning roadmap for the target named entity based on the ordering.

2. The method of claim 1, further comprising:
extracting a set of terms in the one or more corpora of information; and
generating a set of equivalence classes based on a synonym list, wherein each of the named entities corresponds to an equivalence class from the set of equivalence classes.

3. The method of claim 1, further comprising:
identifying a frequency count for each of the named entities;
identifying a co-occurrence count for each unordered pair of the named entities; and
identifying a conditional probability for each ordered pair of the named entities based on the frequency counts and the co-occurrence counts, wherein edges of the graph correspond to the conditional probabilities.

4. The method of claim 1, further comprising:
identifying the target named entity from among the named entities;
selecting a maximum number of hops; and
identifying the subset of the named entities based on whether each of the named entities lies within the maximum number of hops in the graph.

5. The method of claim 1, wherein:
the ordering the subset includes ranking each named entity in the subset in descending order beginning with a named entity associated with a highest basic-ness value, or in ascending order beginning a named entity associated with a lowest advanced-ness value.

6. The method of claim 1, wherein:
generating the learning roadmap comprises generating a recommended order for learning information associated with the subset of named entities.

7. The method of claim 1, wherein:
each of the named entities comprises an information topic.

8. The method of claim 1, wherein:
the one or more corpora of information comprise unstructured corpora of information.

9. A non-transitory computer readable medium storing code for generating learning roadmaps from unstructured information, the code comprising instructions executable by a processor to:
extract a plurality of named entities from one or more corpora of information;
determine co-occurrence frequencies of pairs of named entities;
build a graph based on the co-occurrence frequencies of pairs of named entities;
induce a subgraph for a target topic using the graph;
determine a rank of at least one of basic-ness and advanced-ness for each of the named entities in relation to the target topic;
order the named entities based on the basic-ness or advanced-ness;
the ordering the named entities includes generating a learning roadmap to the target topic using the determined rank of at least one of basic-ness and advanced-ness;
identify a co-occurrence instance of a pair of named entities;
set a co-occurrence frequency of the pair of named entities to one if the pair of named entities is not present in a list of unordered pairs of named entities;
increment the co-occurrence frequency of the pair of named entities if the pair of named entities is present in the list of unordered pairs of named entities; and
increment an individual frequency of each named entity in the pair of named entities.

10. The non-transitory computer readable medium of claim 9, the code further comprising instructions executable by the processor to:
adjust a k value of a k-hop neighborhood to alter a degree of detail in the learning roadmap.

11. A non-transitory computer readable medium storing code for generating learning roadmaps from unstructured information, the code comprising instructions executable by a processor to:
extract a plurality of named entities from one or more corpora of information;
determine co-occurrence frequencies of pairs of named entities;
build a graph based on the co-occurrence frequencies of the pairs of named entities, wherein the graph includes conditional probabilities of the pairs of named entities, and wherein each of the conditional probabilities comprises a ratio of a co-occurrence frequency and an individual frequency;
induce a subgraph for a target topic using the graph;
determine a rank of at least one of basic-ness and advanced-ness for each of the named entities in relation to the target topic; and
order the named entities based on the basic-ness or advanced-ness.

12. The non-transitory computer readable medium of claim 11, wherein:
the building the graph comprises identifying directed edges between the pairs of named entities, wherein each of the directed edges corresponds to one of the conditional probabilities.

13. The non-transitory computer readable medium of claim 11, the code further comprising instructions executable by the processor to:
generate an adjacency matrix, wherein the entries of the adjacency matrix include the conditional probabilities;
generate a product matrix by multiplying the adjacency matrix by a transpose of the adjacency matrix; and
identify an eigenvector of the product matrix, wherein the ordering is based on eigenvalues of the eigenvector.

* * * * *